(12) United States Patent
Friese et al.

(10) Patent No.: US 6,872,648 B2
(45) Date of Patent: Mar. 29, 2005

(54) REDUCED SPLATTERING OF UNPASSIVATED LASER FUSES

(75) Inventors: Gerald R. Friese, Munich (DE); Andy Cowley, Wappingers Falls, NY (US); Mohammed Fazil Fayaz, Pleasantville, NY (US); William T. Motsiff, Essex Junction, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/246,999

(22) Filed: Sep. 19, 2002

(65) Prior Publication Data
US 2004/0056322 A1 Mar. 25, 2004

(51) Int. Cl.[7] .............................................. H01L 21/71
(52) U.S. Cl. ....................................... 438/601; 438/132
(58) Field of Search ................................. 257/173, 209, 257/529, 665; 438/132, 215, 281, 333, 467, 598–601

(56) References Cited

U.S. PATENT DOCUMENTS

| | | | | |
|---|---|---|---|---|
| 5,567,643 A | | 10/1996 | Lee et al. | |
| 5,608,257 A | * | 3/1997 | Lee et al. | 257/529 |
| 5,733,806 A | * | 3/1998 | Grivna et al. | 438/183 |
| 5,757,060 A | | 5/1998 | Lee et al. | |
| 5,914,524 A | * | 6/1999 | Komenaka | 257/529 |
| 6,008,716 A | | 12/1999 | Kokubun | |
| 6,566,729 B1 | | 5/2003 | Okada | |

FOREIGN PATENT DOCUMENTS

| | | |
|---|---|---|
| JP | 01169942 | 7/1989 |
| JP | 11274304 | 10/1999 |
| JP | 2001230325 | 8/2001 |

* cited by examiner

*Primary Examiner*—Long Pham
*Assistant Examiner*—Marcos D. Pizarro-Crespo
(74) *Attorney, Agent, or Firm*—Slater & Matsil, L.L.P.

(57) ABSTRACT

The act of blowing an unpassivated electrical fuse (for example, fuse 405) using a laser can result in the splattering of the fuse material and result in electrical short circuits. A blast barrier (for example blast barrier 406) formed around an area of the fuse that is blown by the laser helps to contain the splattering of the fuse material. The blast barrier may be formed from the same material as the fuses themselves and, therefore, can be created in the same fabrication step.

16 Claims, 8 Drawing Sheets

REDUCED SPLATTERING OF UNPASSIVATED LASER FUSES

FIELD OF THE INVENTION

This invention relates generally to integrated circuit fabrication and particularly to the prevention of splattered fuse material created during the blowing of unpassivated laser fuses.

BACKGROUND OF THE INVENTION

Laser fuses have been used for an extended period of time in the fabrication of integrated circuits. One application of laser fuses is the activation and deactivation of specific functions in an integrated circuit, depending upon intended use of the integrated circuit. For example, a single design for an integrated circuit may be created with a complete set of functionality. However, depending on the price for which the integrated circuit sells, certain functions may be disabled. In another application, the laser fuses permit the replacement of faulty devices and circuits in the integrated circuit with replacement devices and circuits that are operating properly. Typically, when an integrated circuit undergoes testing to verify its operation, faulty portions of the integrated circuit are marked (or stored) by the test equipment. Subsequently, a separate operation is performed wherein certain laser fuses are blown to eliminate the faulty devices and circuits and to replace them with devices and circuits that are operational.

As its name suggests, laser fuses are blown via the use of a high power laser that effectively melts and then vaporizes the fusable links. During the fusing of the fusable links, it is possible for the vaporized fuse material to splatter uncontrollably to adjacent fuses. The splattered fuse material may then cause adjacent fuses to behave incorrectly, i.e., cause a previously blown fuse to behave like an unblown fuse or adjacent blown fuses to become short circuited together. If this happens, the integrated circuit does not behave properly.

Laser fuses come in two major forms, passivated and unpassivated. Passivated laser fuses have a passivation layer formed on top to protect the laser fuse from damage from its operating environment. The use of a passivation layer is especially important for fusable links made from a material that is corrosion-prone, such as copper (Cu). Unpassivated laser fuses do not have the passivation layer and are open to damage from an unfriendly environment. Since unpassivated laser fuses are open to the environment, they tend to be made from corrosion resistant (or relatively corrosion resistant) materials, such as aluminum (Al). Passivated laser fuses have very little sensitivity to the splattering of vaporized fuse material due to the protection afforded by the passivation layer. On the one hand, the passivation layer makes it more difficult to blow the laser fuses. This is due to the fact that the laser used to blow the fuses must have sufficient energy to pass through the passivation layer prior to being able to vaporize the fuse material and to build up sufficient pressure to crack the passivation layer on top of the fusable link to release the vaporized material.

On the other hand, the passivation enables the safe blowing of the laser fuse without affecting neighboring circuits. This is because the passivation layer prevents the immediate and violent release of the molten material of the fusable link. After the fusable link is initially melted by the laser, sufficient energy is absorbed by the fusable link so that the heated fusable link is vaporized. The vaporized material builds up a pressure that will tend to crack its encapsulation material at the material's weakest point, usually the covering passivation layer. The vaporized material explodes from the crack and deposits itself into a very thin and non-conductive film onto the chip surface.

In integrated circuits that are built up by using materials with low mechanical stability, e.g., low-k dielectrics, the cracks created by the release of the vaporized fuse material may appear in the passivation layer and in the underlying dielectric layers. This can cause severe damage to the circuit, particularly if corrosion-sensitive materials such as copper are used for the metal conductive lines. In this case, unpassivated fuses are placed on such integrated circuits to reduce the chance that the underlying surfaces are damaged during the fuse blowing process. To provide an additional measure of protection for the underlying surfaces, there can be a hard dielectric layer placed between the fuse level and the underlying surfaces. Unfortunately, without a passivation layer, the fuse blowing process may suffer in the respect that the molten fuse material may vaporize at a time when there is insufficient heat to prevent the molten metal from being vaporized in its entirety. The vaporization of a portion of the molten metal may result in the splattering of the fuse material that remains in its liquid form. The splattered fuse material may cause electrical short circuits in the unpassivated fuses adjacent to the one being blown. The splattering effect is dependent upon many parameters, such as the power and wavelength of the laser, the dimensions of the fusable link, the material of the fuse material, and the like.

U.S. Pat. No. 6,160,302 proposes the formation of walls between laser fuses to prevent a misaligned laser from unintentionally blowing a fuse that may be adjacent to the fuse that the laser intends to blow.

U.S. Pat. No. 6,300,232 proposes the construction of barriers around individual laser fuses to prevent the propagation of physical damage resulting from the heat induced by the laser during the fuse blowing step.

U.S. Pat. No. 5,899,736 proposes fully enclosing the individual electrically fusable links with a dielectric barrier to prevent the escape of ejected fuse material.

A need has therefore arisen for a way to provide protection for laser fuses that are adjacent to a laser fuse that is being blown without incurring significant cost increases, in terms of additional space requirements and/or additional fabrication steps.

SUMMARY OF THE INVENTION

In one aspect, the present invention provides a semiconductor device comprising a first electrical contact pad, a second electrical contact pad, a fusable link made of a conductive material, the fusable link having a first end coupled to the first electrical contact pad and a second end coupled to the second electrical contact pad, the fusable link to become non-conductive after application of an energy source, and a blast barrier horizontally enclosing the fusable link, the blast barrier to contain fusable link material expelled as a result of the application of the energy source.

In another aspect, the present invention provides a method for creating a blast barrier for a semiconductor device comprising the steps of forming a first and a second electrical contact pad, forming a fusable link that is coupled to the first and second electrical contact pads, and forming a conductive blast barrier, the blast barrier having a first piece formed in parallel to the fusable link and a second piece formed in parallel to the fusable link and on an opposite side of the fusable link from the first piece.

In yet another aspect, the present invention provides a structure comprising a first and second pad, a first metal line formed between the first and second pads, the first metal line touching the first and second pads, and a second and third metal line formed on opposite sides of the first metal line, the second and third metal lines separated from the first metal line by a margin equal to a specified distance.

In summary, the present invention provides a measure of protection against the splattered fuse material of unpassivated laser fuses that may damage the integrity of neighboring fuses. The present invention does not require any additional processing steps. Rather, the specific layout of the metal layer that forms the fusable link is modified. The present invention provides the protection against the splattered material through the use of metal lines that run on both sides of the fusable link. The metal lines may be connected to a via that establishes an electrical connection to other circuitry, but the length and other physical characteristics (such as thickness and width) of the metal lines should be set to ensure that electrical connection between the vias connected to the blown fusable link is not possible after the fuse blowing process takes place. The metal lines serve as a mechanical barrier against splattering molten metal that is generated during the fuse blowing process.

The present invention provides a number of advantages. For example, use of a preferred embodiment of the present invention affords protection for fuses adjacent to the fuse being blown through the use of blast barriers that can be fabricated out of the same material as the laser fuses themselves. By being fabricated out of the same material as the laser fuses, the blast barriers can be formed during the same fabrication step as the laser fuses, eliminating the need for additional fabrication steps. This reduces the overall fabrication time and cost of the integrated circuit containing the laser fuses when compared to other solutions that require additional processing steps.

Also, use of a preferred embodiment of the present invention permits the addition of the blast barriers without changing the pitch of the laser fuses. Therefore, the density of the integrated circuit is not changed. The same number of laser fuses can be placed in the same amount of die area.

Additionally, use of a preferred embodiment of the present invention permits the addition of the blast barriers by requiring only slight modification of the fabrication mask used to create the laser fuses themselves. Therefore, existing designs can be easily modified without requiring any re-routing or re-placement of circuits and devices.

BRIEF DESCRIPTION OF THE DRAWINGS

The above features of the present invention will be more clearly understood from consideration of the following descriptions in connection with accompanying drawings in which:

FIGS. 4a and 4b illustrate a top view of a fuse array immediately prior to and after a laser fuse 405 is blown by a laser, wherein the integral blast barrier prevents the escape of debris expelled by the vaporization of the fuse material;

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention and do not limit the scope of the invention.

Figure 1A:
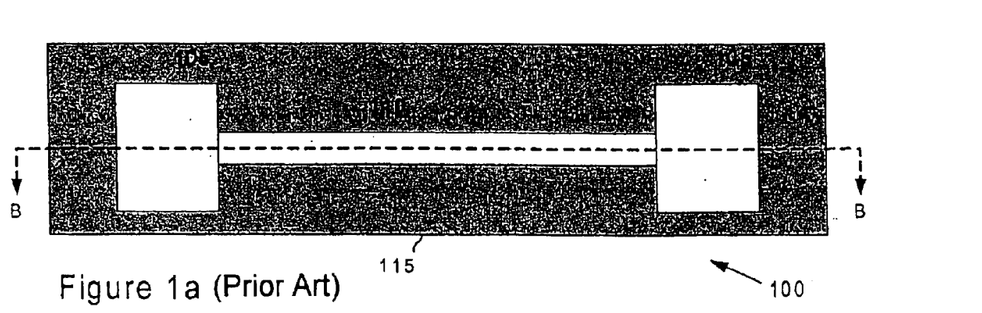
FIGS. 1a, 1b, and 1c illustrate top and cross-sectional views of an unpassivated laser fuse and a top view of a fuse array, respectively.

Referring now to FIG. 1a, the diagram illustrates a top view of an unpassivated laser fuse 100 on a hard dielectric layer 115 which lies on top of a substrate 116 (not seen in FIG. 1a, but present in a cross-sectional view presented in FIG. 1b), As discussed previously, an unpassivated laser fuse differs from a passivated laser fuse in that it lacks a passivation layer that protects it from its environment. When compared to a passivated laser fuse, an unpassivated laser fuse requires a less powerful laser to blow its fuse. This is due to the fact that a laser does not have to first pass through the passivation layer before it can blow the laser fuse. The use of a higher power laser, in turn, produces a greater amount of heat when the laser energy is absorbed by the materials that are exposed to the laser. Certain classes of materials, such as special low "k" (a dielectric constant) materials (for example, substrates made from a combination of organic substances and silicon), are relatively sensitive to heat and typically cannot withstand the excessive amount of heat that is typically involved with the blowing of passivated laser fuses nor the mechanical stresses that are associated with the blowing of the passivated laser fuses. Additionally, the mechanical properties of materials, such as the low k material, may not be well suited to widthstand the pressure developed by the rapidly expanding vaporized fuse material.

The top view of the laser fuse 100 displays the three major parts of the laser fuse: two pads 105 that permit the electrical connection of the laser fuse 100 to circuits and devices, and a fusable link 110. In the illustrated embodiment, the pads 105 are physically larger than the fusable link 110. In an alternate embodiment, the pads 105 and the fusable link 110 could be the same width (e.g., the fuse would appear to be a single line). Note that while the fusable link 110 is displayed as being a straight line, it is possible that the fusable link 110 be formed in a wide variety of shapes, such as a zig-zagged line, a curve, a line of varying width and thickness, and the like. The pads 105 are the portion of the line that permit the attachment of electrically conductive lines to the semiconductor device.

The fusable link 110 is the part of the laser fuse that is heated by the laser and is subsequently broken. Preferably, the two pads 105 and the fusable link 110 are made of the same electrically conductive material. The fusable link 110 may be fabricated from practically any type of metal, but aluminum is a preferred material due to its relatively low melting point and relatively non-reactive properties. Additionally, aluminum is well established as the metal of choice for semiconductor fabrication. Other materials that can be used for the fusable link 110 include gold, and less preferably, copper and silver. Various alloys are also usable, as long as they are relatively immune to corrosion.

Figure 1B:
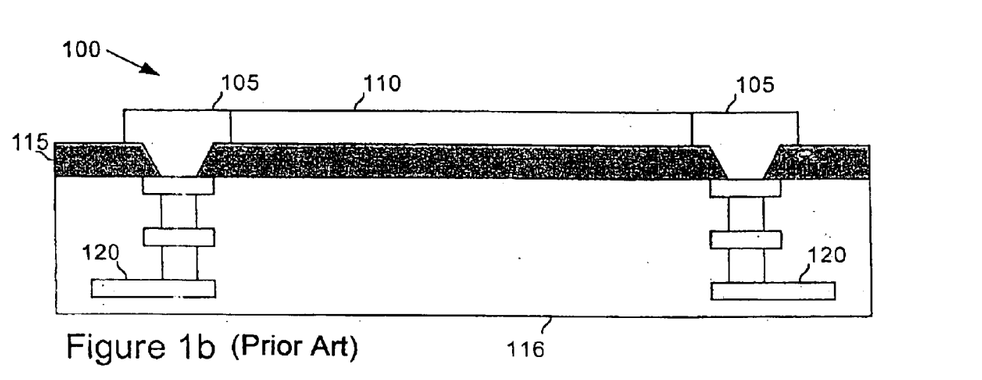

Referring now to FIG. 1b, the diagram illustrates a cross-sectional view of the laser fuse 100 on the hard dielectric layer 115 on top of the substrate 116 displayed in FIG. 1a, with the cross-section made along a dotted line labeled B—B. The cross-sectional view displays the two pads 105 having conductive channels going through the hard dielectric layer 115 and down into the substrate 116 that are connected to connection points 120 for electrical circuits and devices.

Figure 1C:
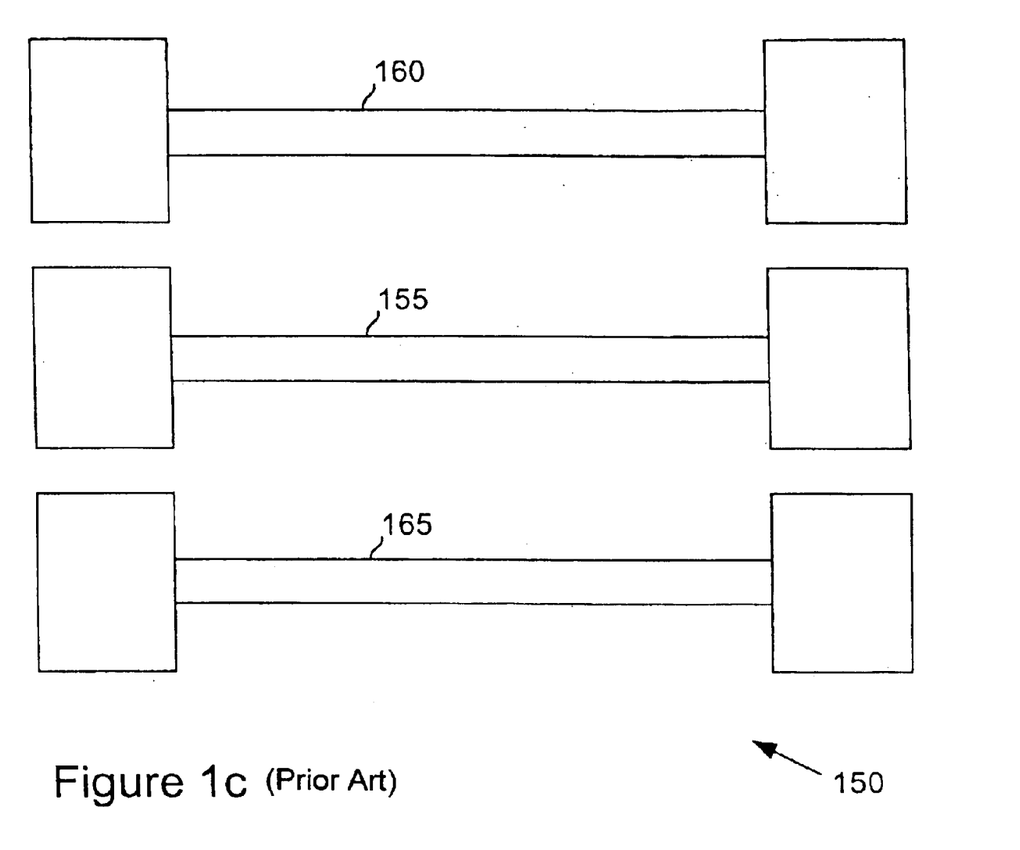

Referring now to FIG. 1c, the diagram illustrates a fuse array 150 of three laser fuses arranged in linear fashion. It is typical to arrange laser fuses in an array, configured as closely together as possible to minimize the amount of surface area that they consume in the integrated circuit. The separation between the fuses is referred to as the fuse pitch, which is defined as the width of the fuse plus the spacing between two adjacent fuses; the smaller the fuse pitch, the closer the fuses are together. The fuse array 150 illustrated in FIG. 1c has three laser fuses (155, 160, and 165), but it is possible for fuse arrays to have any number of fuses grouped together, with a constraint on the number of fuses in a fuse array being the physical size of the semiconductor surface area.

Fuses may be blown in a variety of ways, for example, electrical current is one way to blow fuses. However, due to the delicate nature of most devices and circuits in an integrated circuit, fuses using electrical current to blow the fusable links are not commonly used. Fuses may also be blown by exposing them to radioactive energy. In any event, the present invention also applies to fuses that are blown in ways other than by use of a laser.

Laser fuses use a laser to heat-up and vaporize their fusable links. The use of a laser to melt and then subsequently sever the fusable link is the same, regardless if the laser fuses are of the passivated or unpassivated variety. With passivated laser fuses, the laser must pass through the passivation layer before it can vaporize the fusable link. This may be achieved by using a laser of a particular wavelength that is not absorbed by the passivation layer. For example, a commonly used passivation layer, $SiO_2$, permits laser energy of a certain wavelength to pass without absorbing a significant amount of the laser's energy. The laser's energy can then be focused on blowing the fusable link.

Figure 2A:
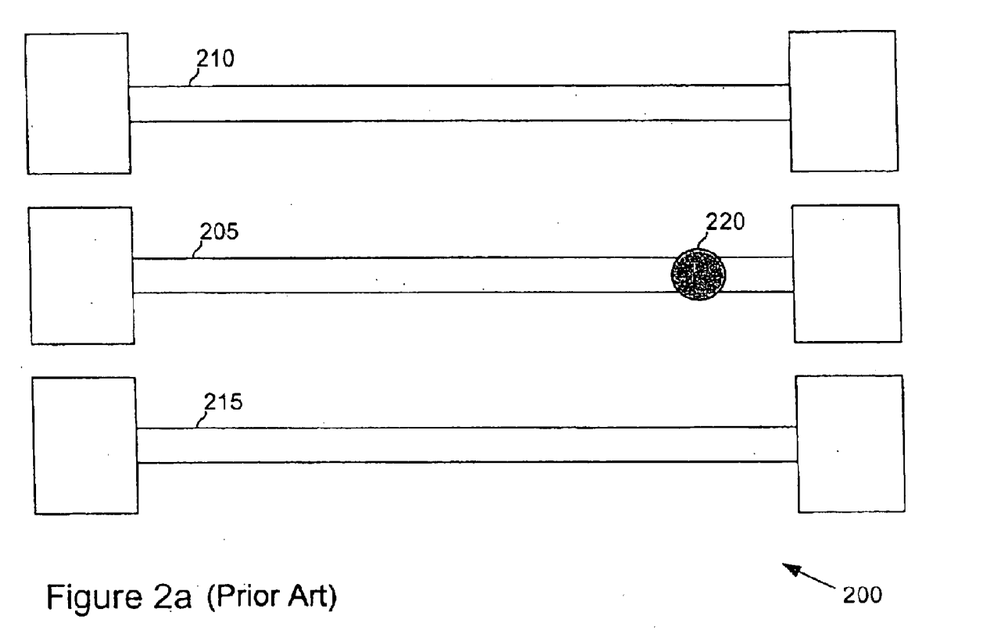
FIGS. 2a and 2b illustrate a top view of a fuse array just immediately prior to and after, respectively, a laser fuse 205 is blown by a laser.

Referring now to FIG. 2a, the diagram illustrates a fuse array 200 wherein a laser spot 220 has been placed onto a fusable link of a laser fuse 205 for the purpose of blowing the laser fuse. It is possible to blow a laser fuse by placing the laser spot 220 relatively close to one end of the fusable link. This can facilitate the ability to blow the laser fuse's fusable link at two locations, one near each end of the fusable link.

As discussed previously, the fusable link is blown by the heating action of the laser spot 220. First the fuse material of the fusable link is melted and then vaporized. The melting and vaporization operation is extremely short in duration to prevent the excessive build-up of heat; basically, the fusing process is finished before the heat is dissipated to areas outside the fuse link area. Therefore, the melting and vaporization of the fuse material can often take on the resemblance of an explosion, wherein the fuse material targeted by the laser spot 220 effectively explodes.

As discussed previously, if the laser fuses were of the passivated laser fuse variety, then the debris from the explosion would most likely not cause any problems for two possible reasons: a first reason being that the passivation layer provides a significant level of protection because it covers the surface of the adjacent fuses, and a second reason being that the passivation layer holds the molten fuse material captive until it has become fully vaporized and the debris generated by the vaporized fuse material tends to be non-conductive due to being dispersed over a large area. However, with unpassivated laser fuses, the molten fuse material is not contained and may be ejected while in a molten state. If the fuse material is ejected in a molten state, it may not disperse enough to become non-conductive. Therefore, the debris may result in short circuits. Depending on where the debris lands, laser fuses adjacent to the one being blown may be short circuited to itself (a problem if the adjacent fuse(s) has previously been blown) or adjacent laser fuses may be electrically short circuited to each other.

Figure 2B:
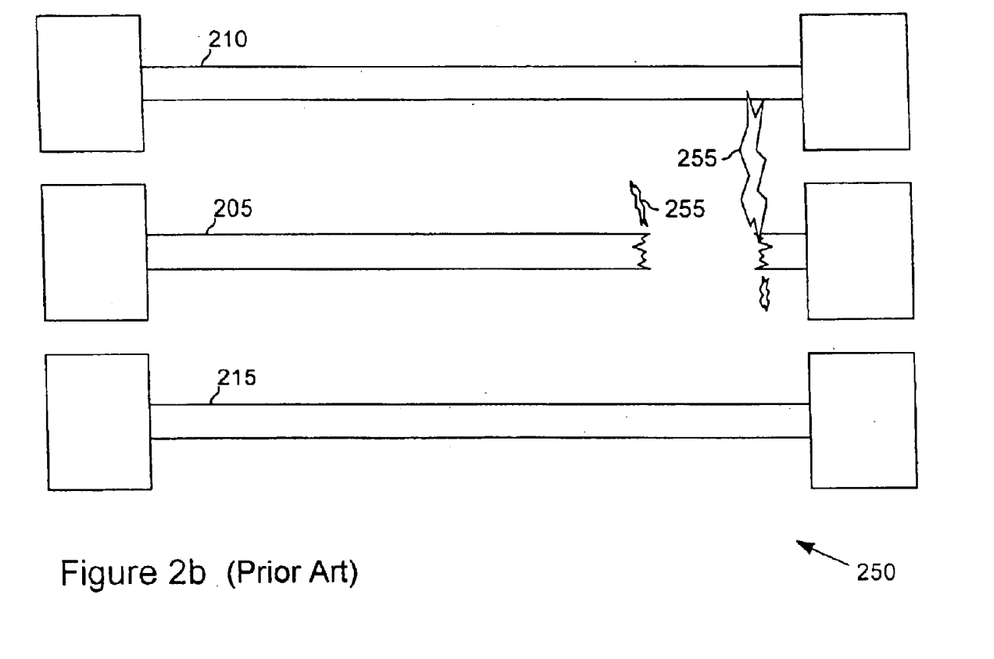

Referring now to FIG. 2b, the diagram illustrates a fuse array 250 wherein a first laser fuse 205 has been blown by a laser and debris (for example, pieces of fuse material 255) from the operation has electrically short circuited adjacent laser fuse 210 to the first laser fuse 205. As an example, the pieces of fuse material 255 that was ejected from the molten fuse material of the fusable link of the first laser fuse 205 has formed an electrical bridge between the first laser fuse 205 and the adjacent laser fuse 210, shorting the two laser fuses together. Because each of the laser fuses are connected to different electrical circuits, an integrated circuit containing laser fuses that are shorted together would most likely not operate properly and would likely be discarded.

Figure 3A:
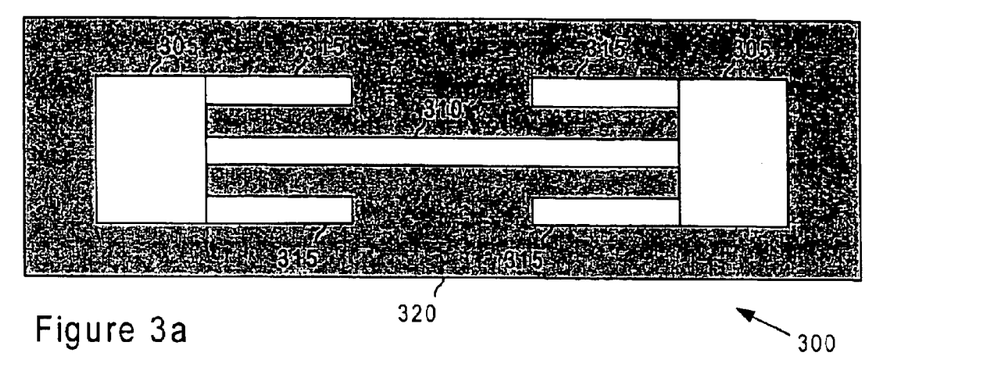
FIGS. 3a, 3b, and 3c illustrate top and side views of an unpassivated laser fuse with an integral blast barrier and a top view of a fuse array, respectively, according to a preferred embodiment of the present invention.

Referring now to FIG. 3a, the diagram illustrates a top view of a laser fuse 300 on a hard dielectric layer 320 on top of a substrate 321 (not seen in FIG. 3a, but present in a side view presented in FIG. 3b) wherein the laser fuse 300 has built-in blast bafflers 315 that help to prevent the ejection of molten fuse material from creating electrical bridges with adjacent laser fuses according to a preferred embodiment of the present invention. The blast shields are formed on each side of a fusable link 310 and on each end of the fusable link 310, forming a horizontal enclosure around an area of the fusable link 310 where the laser will burn through the fusable link 310. Note that as discussed previously, the fusable link 310, although displayed as a straight line, may take other forms, such as a zig-zagged line, a curve, a line of varying widths, and the like.

According to a preferred embodiment of the present invention, the blast barriers 315 are formed from the same material as the laser fuse. Therefore, the blast barriers 315 can be created in the same fabrication step as the laser fuse, saving additional fabrication steps. However, it is possible to form the blast barriers 315 from any other type of material that is compatible with the fabrication of the integrated circuit, including non-conductive materials.

If the blast barriers 315 are created from the same material as the laser fuse or from any electrical conducting material, however, it is necessary that the blast barriers 315 on each end of a single laser fuse not come into contact with each other. If they do come into contact with each other, the net effect is the creation of an electrical conductive link in parallel to the fusable link. If the blast barriers 315 are created from a non-electrically conductive material, then the blast barriers 315 of a single laser fuse can be permitted to come into contact with one another. Also, due to vias, channels, and other features that may be formed in the substrate beneath the laser fuses, it may not be possible to form a blast barrier that runs the entire length of the fusable link.

Figure 3B:
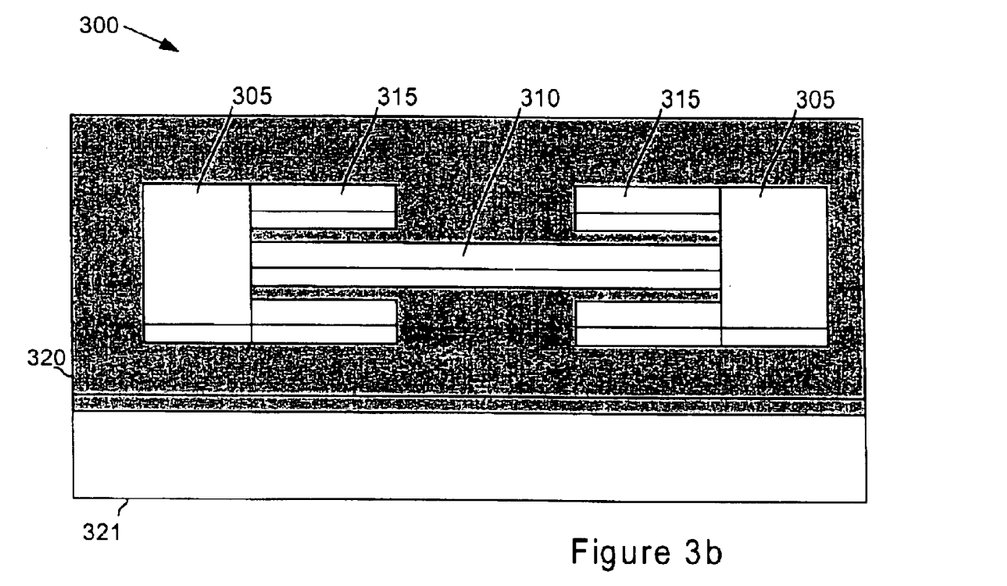
Figure 3C:
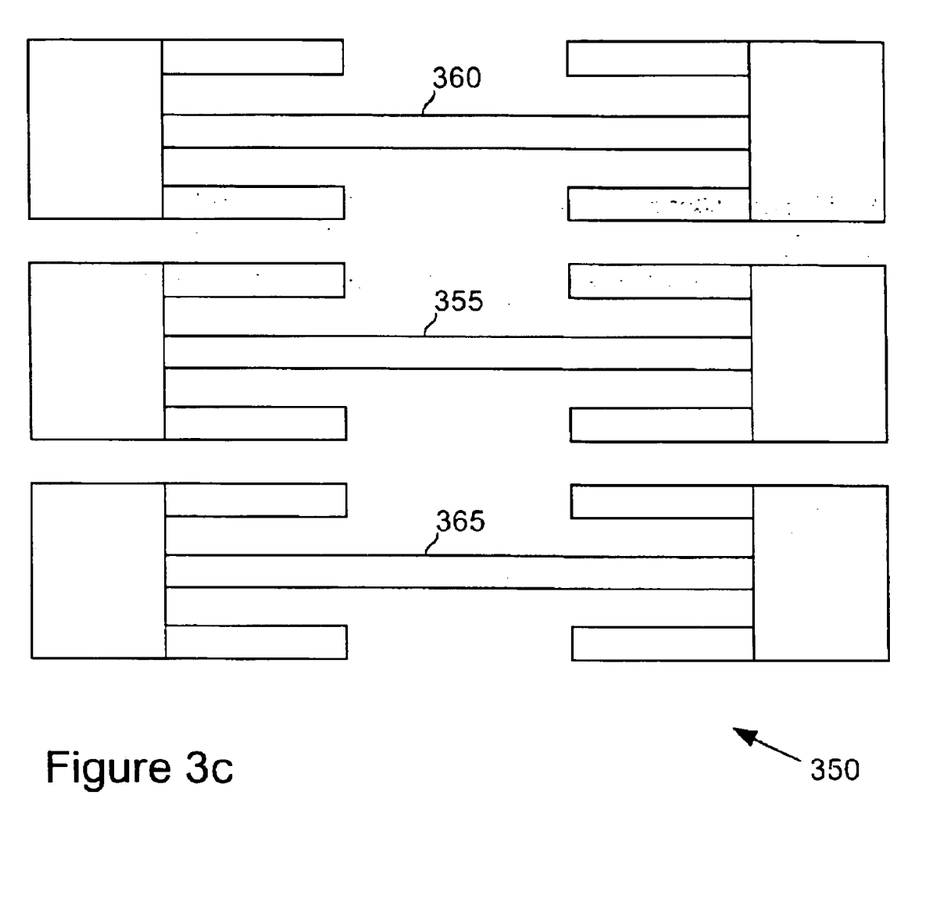

Referring now to FIGS. 3b and 3c, the diagrams illustrate a side view (with a point of view set at approximately 45 degrees above the horizon) of the laser fuse 300 with blast barriers 315 and atop view of a fuse array 350 with three laser fuses 355, 360, and 365, respectively. If the blast barriers 315 are formed in the same fabrication step as the formation of the laser fuses, then the height of the blast barriers 315 will be approximately equal to the height of the laser fuse. However, if the blast barrier 315 was to be formed using a different fabrication step, then the height of the blast barrier 315 may be set to a height that would maximize its effectiveness. This may mean that the blast barrier be created to a height as high as the laser fuses or that they may be made higher than the laser fuses. Note that due to the design of the blast barriers 315, the fuse pitch of the array 350 has not been changed (compared with the fuse array 150 displayed in FIG. 1c). Therefore, it is possible to place a similar number of laser fuses made in accordance with the present invention as the unprotected laser fuses.

Figure 4A:
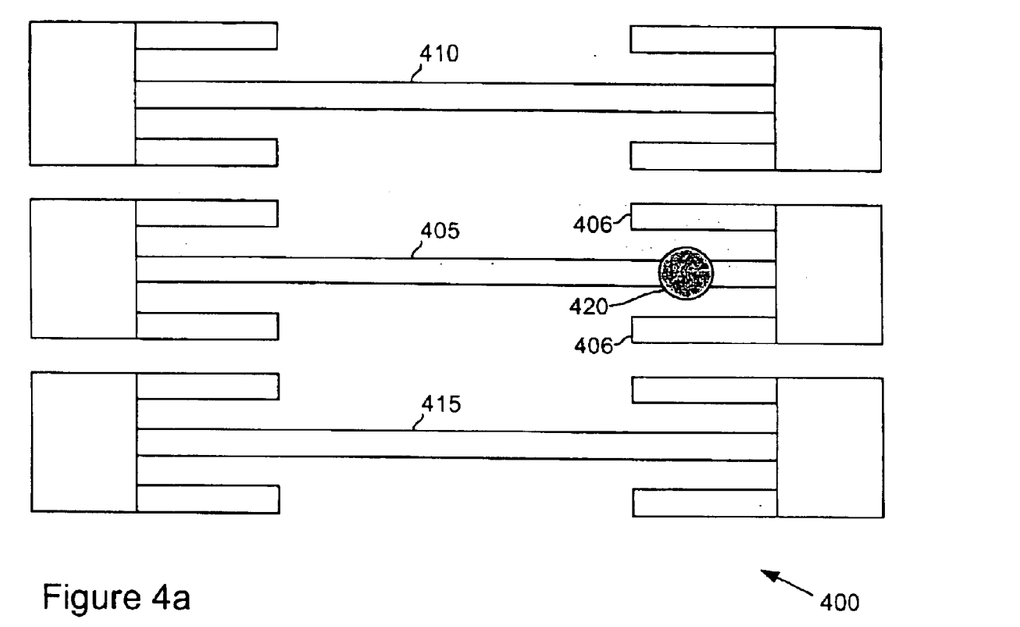
FIGS. 4a and 4b illustrate a top view of a fuse array immediately prior to and after a laser fuse 405 is blown by a laser, respectively, wherein the integral blast barrier prevents the escape of debris expelled by the vaporization of the fuse material.

Referring now to FIG. 4a, the diagram illustrates a fuse array 400 made up of laser fuses with blast barriers and where a laser dot 420 has been placed on a fusable link of a laser fuse 405 for the purpose of breaking the fusable link according to a preferred embodiment of the present invention. Immediately surrounding the fusable link of the laser fuse 405 are blast barriers 406. Note that in order for the blast barriers to be fully effective, the blast barriers 406 should extend past the region of the fusable link that will be vaporized by the laser dot 420. If the blast barrier 406 does not extend past the region of the fusable link that is to be vaporized, then the effectiveness of the blast barrier may be compromised, and vaporized fuse material that is not blocked by the blast barrier may be able to create electrical short circuits with other laser fuses.

Figure 4B:
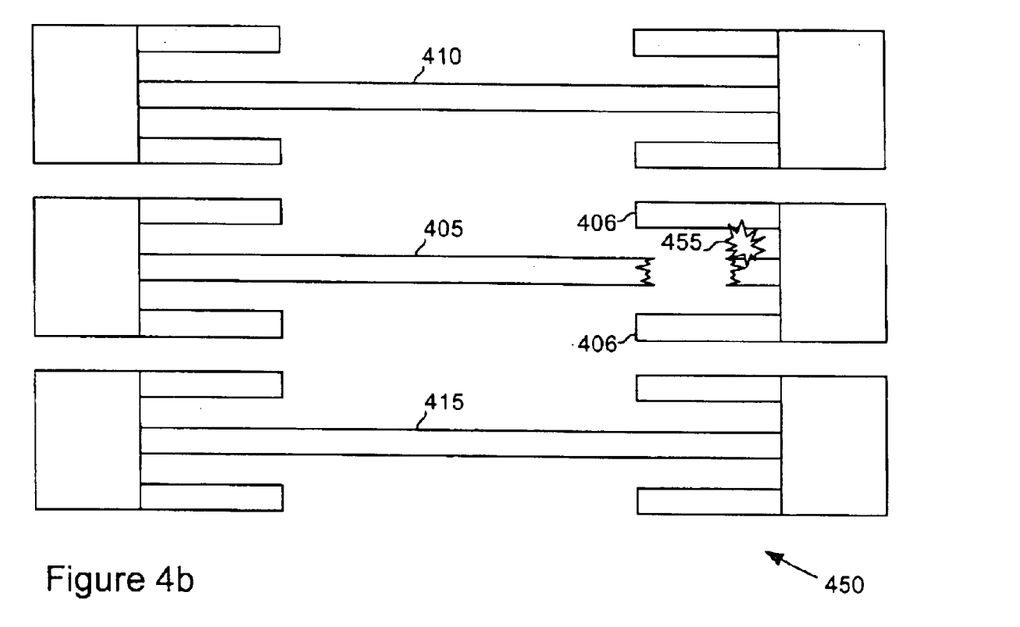

Referring now to FIG. 4b, the diagram illustrates a fuse array 450 wherein a first laser fuse 405 has been blown by a laser and debris (for example, pieces of fuse material 455) from the operation has been blocked by blast barriers 406 surrounding the first laser fuse 405 according to a preferred embodiment of the present invention. The debris 455 that was formed by the vaporization of the fuse material by the laser, for example, the laser dot 420 (FIG. 4a), which would have normally splattered in an unpredictable fashion and over an unpredictable distance, is contained within the blast barriers 406 formed in the vicinity of the place where the first laser fuse 405 is to be blown. The blast barriers 406 create an enclosure around the blast area and contain vaporized fuse material that is ejected during the fuse blowing process.

According to a preferred embodiment of the present invention, the blast barriers may be formed in the same fabrication step as the laser fuses and are created from the same material as the fuses. Alternatively, the blast barriers are created out of any material that is compatible with the fabrication process used to create the integrated circuit. If an additional fabrication step is to be used to create the blast barriers, it is preferred that the blast fuses be created out of an electrically non-conductive material.

Figure 5:
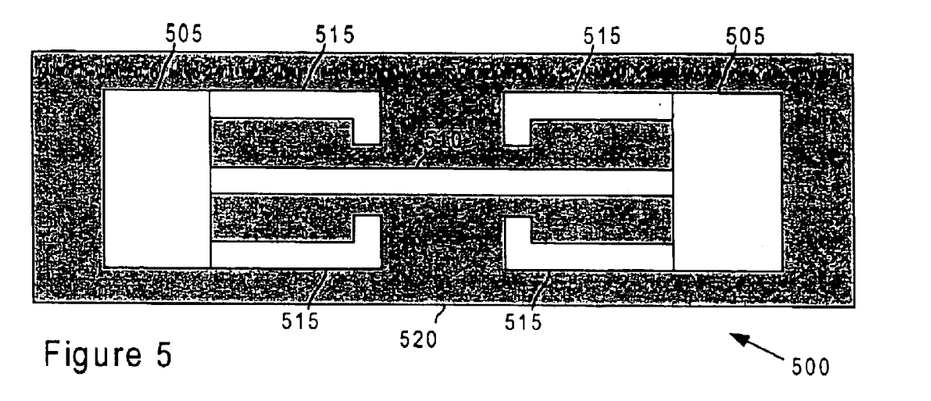
FIG. 5 illustrates an alternative embodiment for a blast barrier according to a preferred embodiment of the present invention.

Referring now to FIG. 5, the diagram illustrates a laser fuse 500 with blast barriers 515 shaped in the form of an L according to a preferred embodiment of the present invention. The blast barriers 515 are created in the form of an L, with the long portion of the L running from the pad and the short perpendicular portion creating a more complete enclosure for the portion of a fusable link 510 to be blown. Note that if the blast barrier 515 is formed from an electrically conductive material, such as the fuse material itself, it should not be permitted to touch the fusable link 510 except at one end (such as through a pad 505). Alternatively, the blast barriers can be formed in other shapes that are as equally effective in fully enclosing the portion of the fusable link to be blown.

Figure 6A:
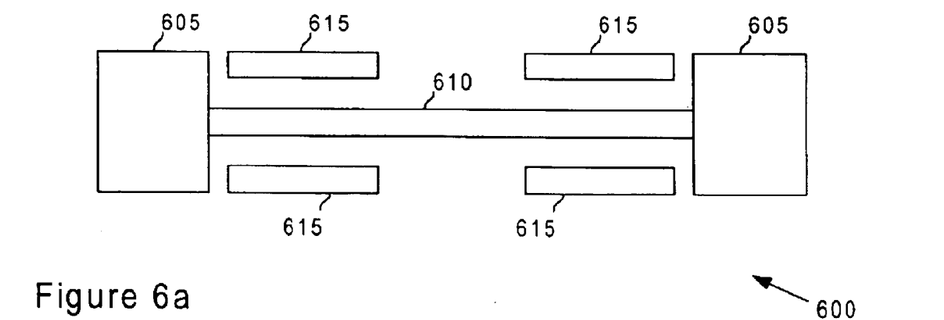
FIGS. 6a and 6b illustrate alternate forms of a blast barrier according to a preferred embodiment of the present invention.
Figure 6B:
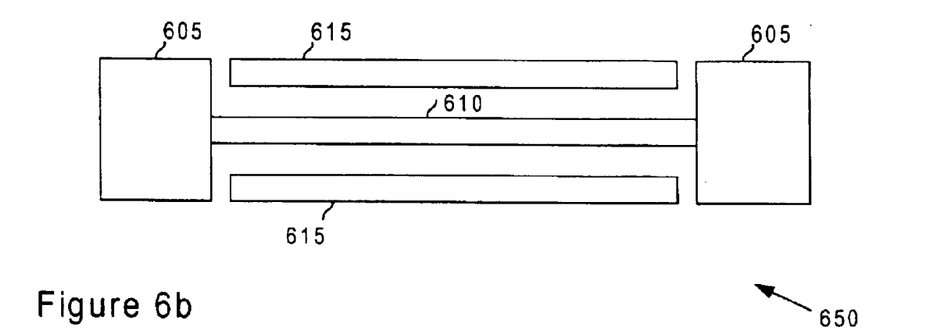

Referring now to FIGS. 6a and 6b, the diagrams illustrate alternate embodiments for laser fuses with blast barriers according to a preferred embodiment of the present invention. In FIG. 6a, the diagram illustrates a laser fuse 600 with a blast barrier 615 that is not coupled electrically to either a pad 605 or a fusable link 610 and the blast barrier 615 is electrically decoupled from itself (i.e., the portion of the blast barrier around one end of the laser fuse 600 is not coupled to the portion of the blast barrier around the other end). While in FIG. 6b, the diagram illustrates a laser fuse 650 with a blast barrier 615 that is not coupled electrically to either pad 605 or a fusable link 610, the blast barrier 615 is formed from a single unit that protects the entire length of the fusable link 610.

Figure 7A:
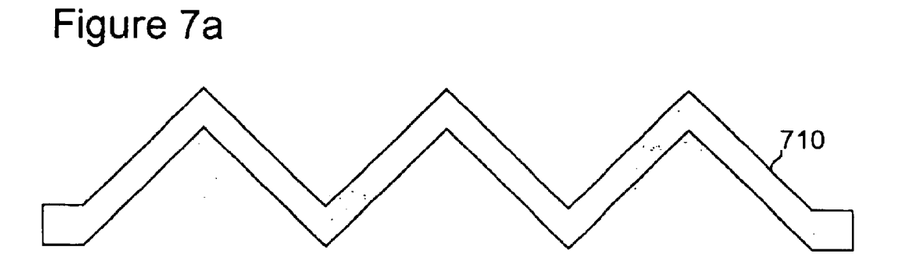
FIGS. 7a, 7b, and 7c illustrate alternate embodiments for a fusable link according to a preferred embodiment of the present invention.
Figure 7B:
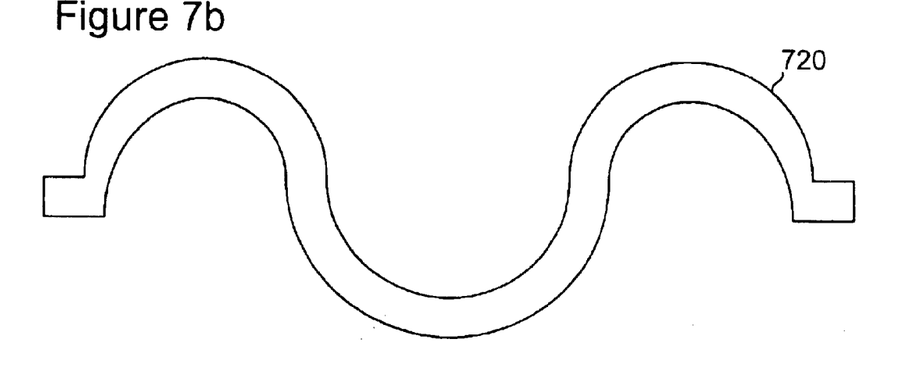
Figure 7C:
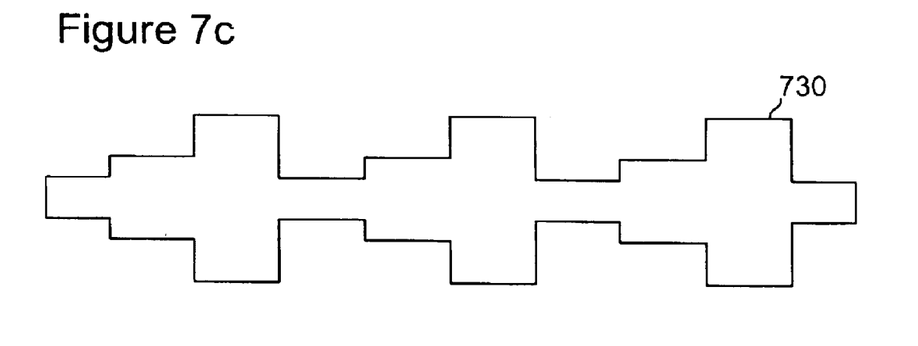

Referring now to FIGS. 7a-c, the diagrams illustrate alternate embodiments for a fusable link according to a preferred embodiment of the present invention. In FIG. 7a, the diagram illustrates a fusable link 710 in the form of a zig-zagged line, while in FIG. 7b, a fusable link 720 in the form of a curved line is presented. Finally, in FIG. 7c, a fusable link 730 in the form of a line with varying line width is illustrated. Other embodiments for the structure of the fusable link are possible, with the final form being dictated by constraints such as a desired resistivity, a maximum amount of current carried, a topography of the underlying substrate, and the like.

According to another preferred embodiment of the present invention, the height of the blast barriers is equal to the height of the laser fuse. However, the height of the blast barrier can be varied so that its height may be greater than or less than the height of the laser fuse in order to more effectively enclose the vaporized blast material.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for creating a blast barrier for a semiconductor device comprising:
    forming an electrical component;
    forming a link coupling at least two electrical connections; and
    forming a blast barrier located between the link and the electrical component, the blast barrier being electrically coupled to at least one of the two electrical connections, wherein the blast barrier has a first piece formed in parallel to the link and a second piece formed in parallel to the link and on an opposite side of the link from the first piece.

2. The method of claim 1, wherein the blast barrier has a first piece on a first side of the link and a second piece formed on a second side of the link.

3. The method of claim 1, wherein the three forming steps are performed in a same fabrication step.

4. The method of claim 1, wherein the blast barrier is formed at a first end of the link, and the method further comprising the step of forming a second blast barrier, wherein the second blast barrier is formed at a second end of the link.

5. A method for creating a blast barrier for a semiconductor device comprising:

forming an electrical component;

forming a first and a second electrical contact pad;

forming a fusable link that is coupled to the first and second electrical contact pads; and forming a blast barrier, the blast barrier being located between the fusable link and the electrical component;

wherein the blast barrier has a first portion and a second portion, the first portion being positioned at a first longitudinal end of the fusable link, the second portion being positioned at an opposing longitudinal end of the fusable link, and at least one of the first portion and the second portion being substantially parallel to the longitudinal axis of the fusable link, and wherein the blast barrier is electrically coupled to the fusable link.

6. The method of claim 5, wherein the step of forming a blast barrier includes forming at least one blast barrier on opposing sides of the longitudinal axis of the fusable link.

7. The method of claim 5, wherein the blast barrier is electrically decoupled from the first and second electrical contact pads and the fusable link.

8. The method of claim 5, wherein the steps of forming the fusable link and forming the blast barrier are performed during the same processing steps.

9. The method of claim 5, wherein the forming steps are performed in a same fabrication steps.

10. A method for creating a blast barrier for a semiconductor device comprising:

forming a first and a second electrical contact pad;

forming a fusable link that is coupled to the first and second electrical contact pads;

forming a first blast barrier formed at a first end of the fusable link, the blast barrier having a first piece formed in parallel to the fusable link and a second piece formed in parallel to the fusable link and on an opposite side of the fusable link from the first piece; and forming a second blast barrier, wherein the second blast barrier is formed at a second end of the fusable link, and wherein the second blast barrier has a first and second piece, the first piece of the second blast barrier formed in parallel to the fusable link and the second piece of the second blast barrier formed in parallel to the fusable link and on an opposite side of the fusable link from the first piece of the second blast barrier.

11. The method of claim 10, wherein the two pieces of the first blast barrier are electrically decoupled from the first and second electrical contact pads and the fusable link.

12. The method of claim 10, wherein the first three forming steps are performed in a same fabrication step.

13. The method of claim 10, wherein the first and second pieces of the first blast barrier are electrically decoupled from the first and second pieces of the second blast barrier.

14. The method of claim 10, wherein the four forming steps are performed in a same fabrication step.

15. The method of claim 10, wherein the first and second pieces of the first blast barrier are conductive.

16. The method of claim 10, wherein the first and second pieces of the first blast barrier consist of the same material as the fusable link.

* * * * *